United States Patent
Gibson et al.

[11] Patent Number: 6,035,262
[45] Date of Patent: Mar. 7, 2000

[54] REAL TIME OBSERVATION SERIAL SCAN TEST ARCHITECTURE

[75] Inventors: Walter E. Gibson, San Jose; Jeffery A. Sprouse, Mountain View; Eduardo M. Lipiansky, Danville; Javad Khakbaz; Michael A. Plum, both of San Jose; Philip R. Manela, San Mateo; Ko Yamamoto, Campbell, all of Calif.

[73] Assignee: Tandem Computers Incorporated, Cupertino, Calif.

[21] Appl. No.: 08/266,431

[22] Filed: Jun. 27, 1994

[51] Int. Cl.[7] ............................................. H03K 3/00
[52] U.S. Cl. .................................... 702/120; 714/727
[58] Field of Search ............................ 371/22.3, 22.1, 371/22.5, 29.1

[56] References Cited

U.S. PATENT DOCUMENTS

| | | | |
|---|---|---|---|
| 4,827,476 | 5/1989 | Garcia | 371/25 |
| 4,945,536 | 7/1990 | Hancu | 371/22.3 |
| 5,210,759 | 5/1993 | De Witt et al. | 371/22.3 |
| 5,253,255 | 10/1993 | Carbine | 371/22.6 |
| 5,293,123 | 3/1994 | Jordan et al. | 324/158 |
| 5,329,471 | 7/1994 | Swoboda et al. | 364/578 |
| 5,384,533 | 1/1995 | Tokuda et al. | 324/158.1 |
| 5,392,296 | 2/1995 | Suzuki | 371/22.3 |

*Primary Examiner*—Patrick Assouad
*Attorney, Agent, or Firm*—Townsend and Townsend and Crew LLP

[57] ABSTRACT

Logic circuitry in the form of an integrated circuit includes a number of scannable registers located at various locations of the logic circuitry to continuously sample signal states thereat. In response to signalling from a maintenance diagnostic processor the scannable registers can be commanded to freeze their content for extraction and observation to determining the operating condition of the logic circuitry.

4 Claims, 2 Drawing Sheets

REAL TIME OBSERVATION SERIAL SCAN TEST ARCHITECTURE

BACKGROUND OF THE INVENTION

The present invention relates to observation of logic circuitry, and in particular to use of serial scan techniques to perform a real-time observation of the logic circuitry without the need of interrupting normal logic operation.

There are available today are a number of techniques for testing digital logic circuitry, but many if not all require normal operation to be interrupted for the test to proceed. There are also fault-tolerant designs that incorporate error checking circuitry for ensuring proper operation, and to halt operation or take some other action if an error is detected. Often, however, there are times when a digital system may not encounter an error, may be in proper operating condition, but stuck in an operating (e.g., hardware) loop, or hung, unable to exit. It is this type of condition that needs detection.

Thus, there is a need, not necessarily for testing a digital system, but merely to provide real-time observation of the on-going operation of the system to ensure that the system is operating correctly without interrupting operation of the system.

SUMMARY OF THE INVENTION

The present invention uses a scan technique to perform periodic observations, in real-time, of the continuing operation of a digital system or circuit without interrupting the normal on-going process of the system.

The invention employs scannable registers such as is employed by various scan test techniques, for example pseudo-random scan testing. A scannable register is one configured to selectively operate in one of two modes: a normal operating mode in which the register performs the function for which it was intended in the design of the digital system (e.g., as a stage in a counter, a multi-bit register, etc.); and, responsive to asserted test signals, in a test mode that causes the scannable registers to be coupled to one another to form one or more shift registers which can receive serial data or, as used with the present invention, from which serial data can be extracted.

Broadly, then, the invention is directed to locating scannable registers within the design of the digital system to sample various signal states within the system. At periodic intervals scan signals are asserted to cause the scannable registers to assume their shift register configuration, and the signal states sampled just prior to the scan signal being asserted scanned out and saved. The scannable registers are returned to their normal state, and allowed to continue their sampling function, until the scan signal is again asserted, and new sampled states extracted. The two sampled states retrieved from the system can then be compared to ensure that the digital system's operation is continuing by noting that certain of them (sampled states) have changed state in the period between samples.

There are a number of advantages achieved by the present invention. First is the ability of the invention to perform real-time monitoring of the digital system. Operation of the digital system need not be terminated, or interrupted even for a short period, to determine its continuing operability. Sampling of state is completely transparent to the ongoing operation of the digital system.

These and other features and advantages of the present invention will become apparent, and more fully appreciated, by those skilled in this art upon a reading of the following detailed description of the invention, which should be taken in conjunction with the accompanying drawings identified below.

DESCRIPTION OF THE PREFERRED EMBODIMENT

Figure 1:
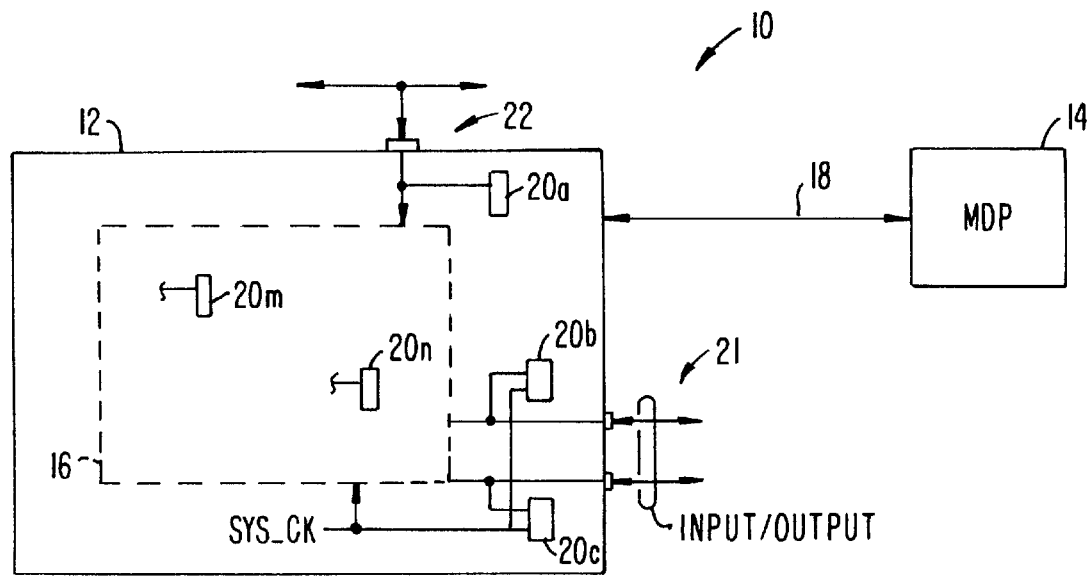
FIG. 1 is a block diagram representation of the invention used in connection with logic circuitry formed on an integrated circuit chip.

Referring now to the Figures, and for the moment FIG. 1, there is broadly and diagrammatically illustrated a digital system designated generally with the reference numeral 10. The digital system 10 is shown in the form of a single integrated circuit 12 for ease of description and understanding of the invention. However, it will be evident to those skilled in this art that the invention can be used in association with a plurality of integrated circuits, or with discrete logic if so desired.

The digital system may either include, or have associated therewith, a maintenance diagnostic processor (MDP) 14 that is connected to internal logic 16 of the integrated circuit 12 by a test bus 18 that carries various test signals between the MDP 14 that the integrated circuit 12. Formed on the integrated circuit 12 are scannable registers 20 (20a, 20b, . . . , 20n) that are placed at strategic locations within the internal logic 16 to samples various signal states.

The integrated circuit 12 can form a part of a larger system, and for that purpose most likely will have assorted input/output (I/O) connections to that larger system. Such I/O connections are illustrated at 21 and 22 which represent bus or signal line connections that in FIG. 1 the integrated circuit 12 to carry I/O signals between the internal logic 16 to locations outside or external to the integrated circuit 12. Thus, certain of the scannable registers 20 (20a, 20b, 20c) are connected to sample the signals communicated on the I/O connections 21, 22. The scannable registers 20 are free-running in the sense that they operate in response to the clock signal (SYS_CK) that is used by the internal logic 16 for synchronous operation; that is, the clock is not controlled when extracting data from the scannable registers. When in their normal mode of operation, i.e., no scan signals being asserted by the MDP 14, the scannable registers 20 operate to sample signal states with each pulse of the SYS_CK clock signal. Thus, the sample changes with each period of SYS_CK when the scannable registers are operating in their normal mode.

As FIG. 1 indicates, while some scannable registers 20 sample the states of I/O signals, other. Other scannable registers 20 are located to sample states occurring in the internal logic 16, such as the continuing operation of various state machines (not shown), counters (not shown), combinatorial logic outputs (not shown), and other synchronous devices. This is represented by the scannable registers 20m, . . . , 20n.

Figure 2A:
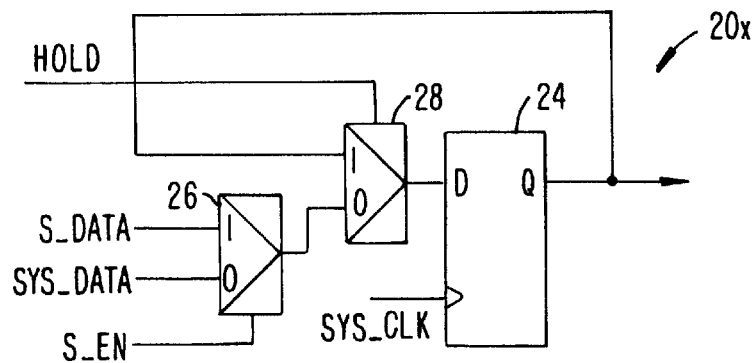
FIGS. 2A and 2B show two different scannable register designs that may be used in connection with the present invention.
Figure 2B:
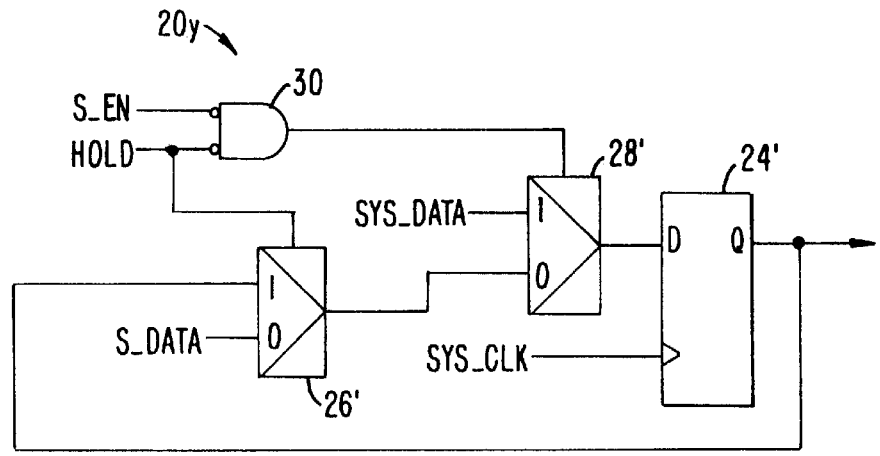

Two constructions of the scannable register 20 are illustrated in FIGS. 2A and 2B, although it will be obvious to those skilled in the art that other configurations can also be constructed. In FIG. 2a, a scannable register 20x is shown as including a D-type flip-flop 24 and a pair of multiplexers 26, 28. The multiplexers 26, 28 operate in response to test signals to select data from among three sources for application to the data (D) input of the flip-flop 24: scan data (S_DATA), system data (SYS_DATA), or the data output (Q) of the flip-flop 24 itself. FIG. 2B illustrates an alternate embodiment of the scannable register, designated with the reference numeral 20y, that also includes a D-type flip-flop 24'. In similar fashion as the flip-flop 24 of FIG. 2A, the data (D) input of the flip-flop 24' receives data selected from among the three sources of S_DATA, SYS_DATA, or the Q output of the flip-flop 24', via the combination of multiplexers 26', 28', and a negative input AND gate 30. Both implementations operate substantially in the same manner. The differences are primarily that the implementation shown in FIG. 2A may be constructed with less circuit components, whereas the implementation shown in FIG. 2b imposes less delay on the system data (SYS_DATA). As mentioned, those skilled in this art will readily see that other configurations are available.

In the context of the present invention, the system data (SYS_DATA) applied to the scannable register 20 (e.g., 20x or 20y of FIGS. 2A or 2B) is the state being sampled by the scannable register 20. The scan data (S_DATA) is that data coupled from the output of another scannable register 20 when the scannable registers are in their shift register configuration as a result a scan enable signal (S_EN) asserted by the MDP 14. The scannable register will be placed in a frozen state, so to speak, when the MDP 14 asserts a HOLD signal. It can now be seen that it is only the system clock (SYS_CK), together with the S_EN and HOLD signals alone control the operation; no attempt is made by the MDP 14 to control the clock applied to the flip-flops 24 of the scannable registers 20.

The scan signals HOLD and S_EN are communicated from the MDP 14 to the scannable registers 20 (FIG. 1) by the bus 18. The S_EN signal connects the scannable registers 20 in scan string configuration so that their contents can be extracted by the MDP 14 for examination. When operating in their normal configuration, i.e., with the HOLD and S_EN signals not asserted, certain of the scannable registers 20 (e.g., those shown as scannable registers 20a, 20b, 20c, and others not shown) of the integrated circuit 12 are connected to sample the signal states (SYS_DATA) of input and/or output signals applied at the connections 21 and 22 each clock period of the SYS_CK clock signal. The sampled state at any moment in time can be extracted by asserting the S_EN test signal to cause the scannable registers 20 to form a one or more shift registers ("scan chains") so that the MDP 14 can scan out and extract the sampled states.

Figure 3:
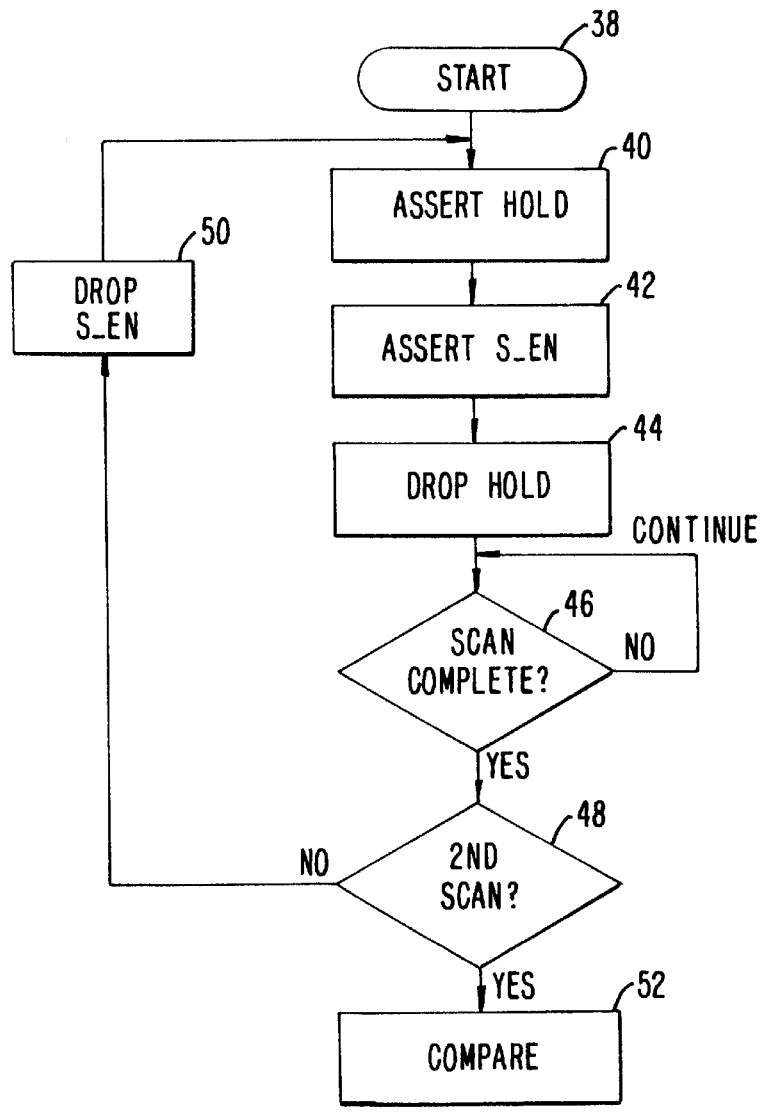
FIG. 3 is a flow diagram that illustrates control of the invention for sampling the operating state of the associated logic circuitry.

With the scannable registers 20 connected at various points in the integrated circuit in the manner described, real-time observation of the integrated circuit 12 can be made to determine its continuing operation in the following manner. Before they are called into play by the MDP 14, each of the scannable registers 20 are continuously sampling the states of the various input and output signals and internal states of the integrated circuit 12. Referring to the flow diagram of FIG. 3, illustrated is the operation of the real-time observation routine, beginning with step 38: the continuous sampling of states. (The S_EN and HOLD signals are held in their non-asserted states.) To extract a sample for observation the routine first moves to step 40 where the MDP 14 asserts the HOLD signal to freeze the scannable registers 20 with a sample. So long as the HOLD signal is asserted the sample will be retained.

Next, at step 42, the MDP 14 asserts the scan enable (S_EN) signal, the effect of which is to connect the scannable registers 20 in the one or more shift register configurations. Then, at step 44, the MDP 14 de-asserts (drops) the HOLD signal and, at step 46, extracts the content of the scannable registers 20 by merely letting the SYS_CK signal shift out that content for communication to the MDP 14 via the test bus 18. The extraction continues (step 46) until the content of each scannable register 20 has been retrieved.

In order to determine continuing operability of the integrated circuit 12, two such samples are needed, at different moments in time, and those two samples compared to see if state changes were made in the interim. If certain bits in one sample have states different from what they have in the other sample, it is assumed that the integrated circuit 12 is continuing operation, receiving data from, providing data to, and otherwise communicating with the rest of the system in which it may be included. Similarly, observation of the sampled internal states can also provide information as to the operation of the integrated circuit 12. Alternatively, if such a comparison shows that the states of the sampled signals did not change between samples it may safely be assumed that the integrated circuit 12 has somehow gone into an operating loop, or some idle condition from which it cannot escape. Accordingly, a second sample must be taken and compared to the first: thus, step 48 determines whether or not the scan completed in step 46 was the first sample or the second sample. If the second sample has not been obtained, the procedure returns to step 40, via step 50 where the MDP 14 deasserts the S_EN to allow the scannable registers 20 to assume their normal configuration to again continuously sample signals of the integrated circuit 12 for a period of time. Returning to step 40, the second sample of the states is captured by asserting the HOLD test signal. Steps 42, 44, and 46 are repeated to withdraw the second sample, so that now when step 48 is reached, both samples have been obtained. Accordingly, at step 52 the comparison is made and, if as discussed above there is a change of state of any of the bits between the two samples, it is assumed that the integrated circuit 12 is continuing operation.

This comparing of the two samples of digital states may be nothing more than displaying the two samples to a test person, who can then make the necessary observation, and draw the relevant conclusions therefrom. Alternatively, the entire process can be automated, wherein the MDP 14 is configured to make the necessary comparison and provide an error indication when states of the two samples do match.

The present invention is advantageously used in connection with pseudo-random test techniques that also uses scannable registers such as used here. Thus, certain of the scannable registers may be used for both the pseudo-random tests, and later (or earlier) for the real-time observations of the present invention. This is mentioned because if that is the case, those scannable registers which do perform such dual functions will need to have special scan enable signals applied to them so that they can be included in the shift register(s) formed for the pseudo-random scan test environment, as well as the separate sampled observations of the present invention.

What is claimed is:

1. An observable logic circuit formed on an integrated circuit chip, comprising:

internal logic circuitry operating to produce a plurality of data signals;

a number of scannable registers coupled to receive predetermined ones of the plurality of data signals, the number of scannable registers being responsive to a first test signal to sample first and second states of the predetermined ones of the plurality of data signals at first and second periods of time, respectively, and to a second test signal to form at least one serial shift register to shift out the sample first and second states; and means for comparing the first and second states to one another to issue an indication of error when a miscompare is not detected.

2. The observable logic circuit of claim 1, wherein the plurality of data signals includes a number of data output signals, and wherein the predetermined ones of the plurality of data signals includes selected ones of the number of data signals.

3. A method of performing real-time observation of a logic circuit having at least one output for providing data thereat, the method including the steps of:

sampling the output a first moment in time;

again sampling the output a subsequent moment in time;

comparing the sample of the first moment in time with the sample of the subsequent moment in time to determine if a change in state has occurred; and providing an error indication if no change of state has occurred.

4. A method of performing real-time observation of a logic circuit operating to produce a number plurality of data signals, the method including the steps of:

sampling a first state of predetermined ones of the number of data signals at a first moment in time;

sampling a second state of the predetermined ones of the number of data signals at a successive moment in time;

comparing the first and second states; and providing an error indication when predetermined ones of the first state match corresponding predetermined ones of the second state.

* * * * *